United States Patent
Liu et al.

(10) Patent No.: US 11,789,562 B2
(45) Date of Patent: Oct. 17, 2023

(54) TOUCH SCREEN DETECTION CHIP COMBINATION AND TERMINAL DEVICE

(71) Applicant: FOCALTECH ELECTRONICS, LTD., Guangdong (CN)

(72) Inventors: Weiping Liu, Guangdong (CN); Shen Chia Huang, Guangdong (CN); Hepeng Su, Guangdong (CN)

(73) Assignee: FOCALTECH ELECTRONICS, LTD., Guangdong (CN)

( * ) Notice: Subject to any disclaimer, the term of this patent is extended or adjusted under 35 U.S.C. 154(b) by 147 days.

(21) Appl. No.: 17/440,288

(22) PCT Filed: Mar. 4, 2020

(86) PCT No.: PCT/CN2020/077692
§ 371 (c)(1),
(2) Date: Sep. 17, 2021

(87) PCT Pub. No.: WO2020/192371
PCT Pub. Date: Oct. 1, 2020

(65) Prior Publication Data
US 2022/0147218 A1     May 12, 2022

(30) Foreign Application Priority Data
Mar. 22, 2019   (CN) .......................... 201910223151.6

(51) Int. Cl.
*G06F 3/041* (2006.01)
(52) U.S. Cl.
CPC ................ *G06F 3/04166* (2019.05)

(58) Field of Classification Search
None
See application file for complete search history.

(56) References Cited

U.S. PATENT DOCUMENTS

| 9,454,274 | B1* | 9/2016 | Kurikawa ........... G06F 3/04166 |
| 2009/0250269 | A1 | 10/2009 | Hung et al. |
| 2009/0251437 | A1* | 10/2009 | Hung .................. G06F 3/04166 345/174 |
| 2011/0185093 | A1* | 7/2011 | Matsuo ................ H04L 12/403 710/110 |
| 2011/0242015 | A1 | 10/2011 | Lou |

(Continued)

FOREIGN PATENT DOCUMENTS

| CN | 102023769 | 4/2011 |
| CN | 102109914 | 6/2011 |

(Continued)

OTHER PUBLICATIONS

International Search Report issued in PCT/CN2020/077692 dated Apr. 23, 2020.

*Primary Examiner* — Krishna P Neupane
(74) *Attorney, Agent, or Firm* — Workman Nydegger

(57) ABSTRACT

A touch screen detection chip combination includes a master detection chip and a slave detection chip. The master detection chip and the slave detection chip process touch signals of different regions of a touch screen. The master detection chip is connected to the slave detection chip, and the master detection chip controls the slave detection chip to perform touch signal process on the touch screen. A terminal device is further provided.

10 Claims, 3 Drawing Sheets

(56) References Cited

U.S. PATENT DOCUMENTS

| | | | | |
|---|---|---|---|---|
| 2012/0057508 | A1* | 3/2012 | Moshfeghi | H04B 7/14 375/222 |
| 2014/0333559 | A1* | 11/2014 | Wilson | G06F 1/12 345/173 |
| 2017/0102794 | A1 | 4/2017 | Wang | |

FOREIGN PATENT DOCUMENTS

| | | |
|---|---|---|
| CN | 203552220 | 4/2014 |
| CN | 105138186 | 12/2015 |
| CN | 105353928 | 2/2016 |
| CN | 105892757 | 8/2016 |
| CN | 106527784 | 3/2017 |
| CN | 108614643 | 10/2018 |
| CN | 109426426 | 3/2019 |
| CN | 109752618 | 5/2019 |
| CN | 210037999 | 2/2020 |

\* cited by examiner

TOUCH SCREEN DETECTION CHIP COMBINATION AND TERMINAL DEVICE

The present application is a 371 application of International Patent Application No. PCT/CN2020/077692, titled "TOUCH SCREEN DETECTION CHIP COMBINATION AND TERMINAL DEVICE", and filed Mar. 4, 2020, which claims priority to Chinese Patent Application No. 201910223151.6, titled "TOUCH SCREEN DETECTION CHIP COMBINATION AND'TERMINAL DEVICE", and filed on Mar. 22, 2019 with the Chinese Patent Office, which are incorporated herein by reference in their entirety.

FIELD

The present disclosure relates to the field of electronic device, and in particular to a touch screen detection chip combination and a terminal device.

BACKGROUND

With the emergence of intelligent terminal devices such as smart phones and tablet computers, touch screens are used widely. According to the application requirement of touch screens, many touch screen detection chips are provided on the market. As shown in FIG. 1, different touch screen detection chips (integrated circuits, ICs) are adopted to perform touch detection on touch screens with different sizes. Considering the size of a hand, a touch screen is generally divided into multiple 5 mm*5 mm square regions, and then touch detection is performed on each of the square regions separately. A larger touch screen indicates more square regions and more detection electrodes, and the touch screen detection chip for detecting the touch screen should be arranged with more channels. As shown in FIG. 1 in the specification, the touch screen shown in the left part of the Figure is smaller than the touch screen shown in the right part of the Figure, thus a touch screen detection chip, with fewer detection channels than a touch screen detection chip for performing touch detection on the touch screen in the right part, performs touch detection on the touch screen in the left part. Based on the number of the detection channels, the area of the touch screen detection chip is determined, and the cost of the product is determined. With the increase of the size of the touch screens in the market, in a case that all touch detection functions are to be performed by one IC, the IC will have a very large area. IC development is difficult, cycled, and costly. It is required to design different touch detection chips for touch screens with different sizes, requiring a lot of manpower, material resources and time. Moreover, for a chip having an excessively large size, the difficulty of timing design inside the chip increases significantly, and the production yield decreases significantly.

Apparently, considering compatibility, chips with more channels may be adopted for touch screens with small sizes, resulting in "big horse-drawn carts" and wasting resources.

The above technical problems in the conventional technology are required to be solved.

SUMMARY

According to the present disclosure, a touch screen detection chip combination is provided. The chip combination has a cascade structure based on which multiple touch screen detection chips may operate together to perform touch detection on a touch screen with a large size.

According to the present disclosure, a terminal device is further provided. The terminal device includes the touch screen detection chip combination.

According to a first aspect of the present disclosure, a touch screen detection chip combination is provided. The chip combination includes a master detection chip and a slave detection chip. The master detection chip and the slave detection chip are configured to process touch signals of different regions of a touch screen. The master detection chip is connected to the slave detection chip. The master detection chip is configured to control the slave detection chip to perform touch signal process on the touch screen.

Based on the first aspect, in a first implementation, the master detection chip is arranged with a potential pin, and the slave detection chip is arranged with a second pin. The potential pin is used for receiving a first potential, and the second pin is used for receiving a second potential. The first potential is different from the second potential. Based on the first implementation in the first aspect, in a second implementation, the first potential is a power supply potential and the second potential is a ground potential, or the first potential is a ground potential and the second potential is a power supply potential.

Based on the first implementation of the first aspect, in a third implementation, the master detection chip is arranged with a start signal output pin and a clock signal output pin, and the slave detection chip is arranged with a start signal input pin and a clock signal input pin. The start signal output pin of the master detection chip is connected to the start signal input pin of the slave detection chip, thus the master detection chip controls the slave detection chip to perform touch detection. The clock signal output pin of the master detection chip is connected to the clock signal input pin of the slave detection chip, thus the master detection chip controls the slave detection chip to perform touch detection at the same frequency as the master detection chip.

Based on the third implementation of the first aspect, in a fourth implementation, the number of the master detection chip is one and the number of the slave detection chip is more than one. The master detection chip is arranged with multiple synchronous start signal output pins and multiple synchronous clock signal output pins, and each of the multiple slave detection chips is arranged with one start signal input pin and one clock signal input pin. For each of the plurality of slave detection chips, the start signal input pin of the slave detection chip is connected to one of the multiple start signal output pins of the master detection chip, and the clock signal input pin of the slave detection chips is connected to one of the multiple clock signal output pins of the master detection chip.

Based on the first implementation of the first aspect, in a fifth implementation, each of the master detection chip and the slave detection chip is arranged with a start signal output pin, a start signal input pin, a clock signal output pin, and a clock signal input pin. The start signal output pin of the master detection chip is connected to a middle position between the master detection chip and the slave detection chip, and then is connected to the start signal input pin of the master detection chip and the start signal input pin of the slave detection chip. The master detection chip is configured to perform touch detection after receiving a start signal, and the slave detection chip performs touch detection after receiving a start signal. The clock signal output pin of the master detection chip is connected to a middle position between the master detection chip and the slave detection chip, and then is connected to the clock signal input pin of the master detection chip and the clock signal input pin of the slave detection chip. The master detection chip performs touch detection after receiving a clock signal, and the slave detection chip performs touch detection at the same frequency as the master detection chip after receiving a clock signal.

Based on the fifth implementation of the first aspect, in a sixth implementation, the master detection chip is arranged with an up-conversion module for up-converting a frequency of a clock signal received via the clock signal input pin of the master detection chip, and the master detection chip performs touch detection at the up-converted frequency. The slave detection chip is arranged with an up-conversion module for up-converting a frequency of a clock signal received via the clock signal input pin of the slave detection chip, and the slave detection chip performs touch detection at the up-converted frequency.

Based on the fourth or fifth implementation of the first aspect, in a seventh implementation, the number of the master detection chip is one and the number of the slave detection chip is two. The two slave detection chips are respectively arranged at two sides of the master detection chip.

Based on the third or fifth implementation of the first aspect, in an eighth implementation, the master detection chip performs one frame of touch detection after receiving a start signal, and the slave detection chip performs one frame of touch detection after receiving a start signal; or the master detection chip performs two or more frames of touch detection after receiving a start signal, and the slave detection chip performs two or more frames of touch detection after receiving a start signal; or the master detection chip performs one frame of touch detection after receiving two or more start signals, and the slave detection chip performs one frame of touch detection after receiving two or more start signals.

According to a second aspect of the present disclosure, a terminal device is provided. The terminal device includes a touch screen and a touch screen detection chip combination. The touch screen detection chip combination includes the touch screen detection chip combination according to the first aspect or according to any one of the first implementation to the eighth implementation of the first aspect.

As can be seen from the above technical solutions, the embodiments of the present disclosure have the following advantages.

In the embodiments of the present disclosure, the touch screen detection chip combination includes a master detection chip and a slave detection chip. The master detection chip and the slave detection chip process touch signals of different regions of a touch screen. The master detection chip is connected to the slave detection chip. The master detection chip controls the slave detection chip to perform touch signal process on the touch screen. A terminal device is further provided according to the embodiments of the present disclosure. In operation, the master detection chip obtains a touch signal of a first region of the touch screen, and the slave detection chip obtains a touch signal of a region other than the first region of the touch screen, thereby processing touch signals of all touch sensing regions of the touch screen. The master detection chip is connected to the slave detection chip, and the master detection chip controls the slave detection chip to perform touch signal process on the touch screen synchronously, thereby adapting touch screens with different sizes based on a combination of touch screen detection chips without changing the structure of the touch detection chip, reducing cost, and improving compatibility.

DETAILED DESCRIPTION OF EMBODIMENTS

In order to make those in the art understand the technical solutions according to the present disclosure well, the technical solutions in the embodiments of the present disclosure are clearly and completely described below in conjunction with the drawings in the embodiments of the present disclosure. Apparently, the embodiments described in the following are only some embodiments of the present disclosure, rather than all the embodiments. Any other embodiments obtained by those skilled in the art based on the embodiments of the present disclosure without any creative effort should fall within the protection scope of the present disclosure.

Terms such as "first", "second", "third", "fourth" and the like (if exists) in the specification, the claims and the drawings of the present disclosure are used to distinguish similar objects, rather than describe a particular order or priority. It should be understood that the data used in this way may be interchangeable under an appropriate condition, so that the embodiments described herein can be implemented in an order other than those illustrated or described herein. In addition, terms of "include", "comprise" or any other variants are intended to be non-exclusive. For example, a process, a method, a system, a product or a device including a series of steps or units includes not only the steps or units that are clearly enumerated but also other steps or units that are not clearly enumerated, or also include the steps or units inherent for the process, the method, the system, the product or the device.

According to the embodiments, a touch screen detection chip combination and a terminal device are provided to be compatible with touch screens having different sizes, thereby reducing cost. Multiple ICs are combined together to perform touch detection on a touch screen with a large size, and any single IC included in the touch screen detection chip combination may perform touch detection on a touch screen with a small size.

For ease of understanding, an implementation in an embodiment of the present disclosure is described below with reference to FIG. 2.

Figure 1:
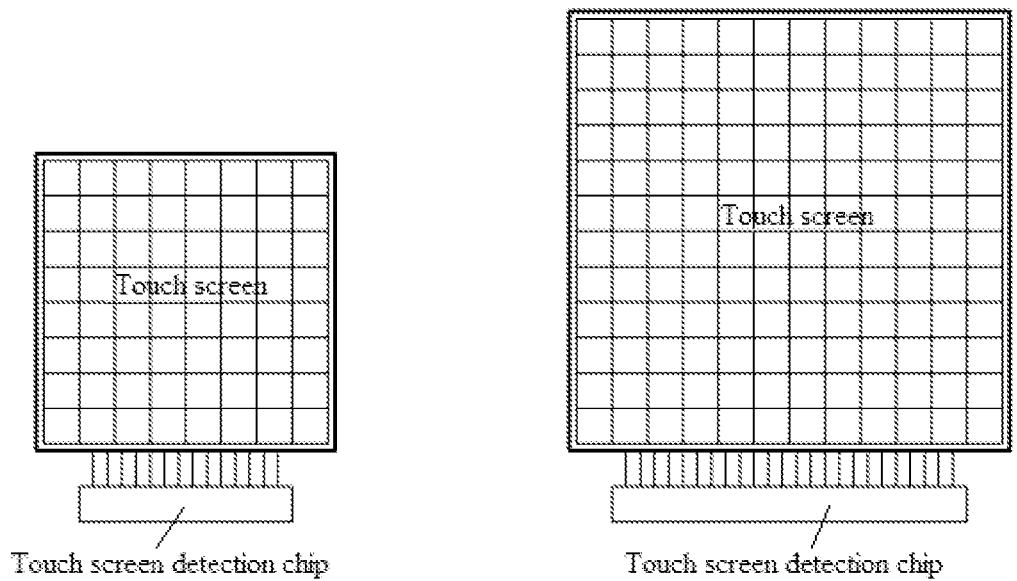
FIG. 1 is a schematic diagram showing connections between touch screens with different sizes and touch screen detection chips according to the conventional technology.
Figure 2:
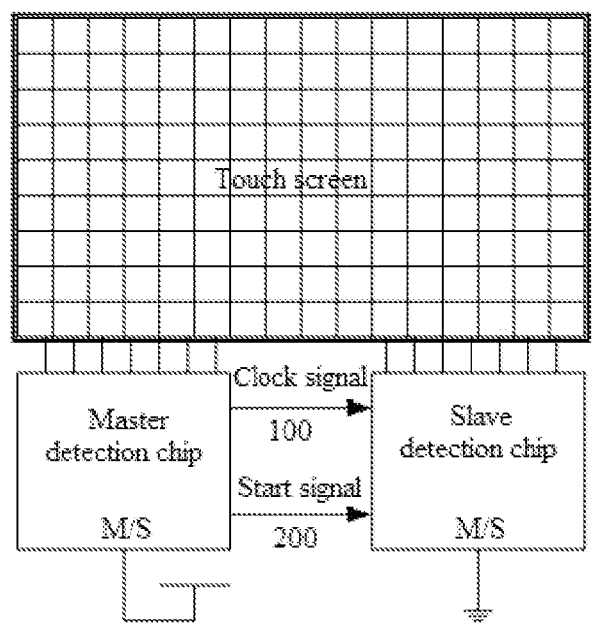
FIG. 2 is a schematic diagram of a touch screen detection chip combination according to an embodiment of the present disclosure.

As shown in FIG. 2, a touch screen detection chip combination according to an embodiment of the present disclosure includes a master detection ship and a slave detection chip. The master detection ship and the slave detection chip are configured to process touch signals of different regions of a touch screen. The master detection ship is connected to the slave detection chip. The master detection ship controls the slave detection chip to perform touch signal process on the touch screen. The master detection chip and the slave detection chip may be implemented by integrated circuit (IC) chips.

In the embodiment, there is no difference in the function configurations of the master detection chip and the slave detection chip in a case that the master detection ship and the slave detection chip do not operate. It is only required to perform configurations on the detection chips to perform functions of the master detection chip and the slave detection chip in a case that the detection chips operate in combination. That is, a touch detection chip may be configured to perform the function of the master detection chip or the function of the slave detection chip. In a case that multiple touch screen detection chips are combined together, one of the multiple touch screen detection chips controls the touch detection process. The touch screen detection chip configured to control the touch detection process serves as the master detection chip, and the other touch screen detection chip serves as the slave detection chip. In operation, the master detection chip obtains a touch signal of a first region of the touch screen, the slave detection chip obtains a touch signal of a region other than the first region of the touch screen, thereby processing touch signals of all the touch sensing regions of the touch screen. The master detection chip is connected to the slave detection chip, and the master detection chip controls the slave detection chip to perform touch signal process on the touch screen synchronously.

In the embodiment, a combination of touch screen detection chips is used to adapt to touch screens with different sizes without changing the structure of the touch screen detection chip.

The master detection chip controls the detection process, thus there is only one master detection chip. A system of a terminal device (a mobile phone, a tablet, a computer, and the like) only communicates with the master detection chip. The master detection chip transmits initial codes, FireWare, display data of a frame, and the like to the slave detection chip. After performing touch scanning, the slave detection chip transmits touch raw data to the master detection chip. Then, the master detection chip performs touch determination, coordinate calculation, and the like. Finally, the master detection chip reports to the system.

The master detection chip and the slave detection chip respectively include a potential pin (which is represented by M/S in the Figure). The master detection chip is configured to receive a first potential via the potential pin of the master detection chip. The salve detection chip is configured to receive a second potential via the potential pin of the salve detection chip. The first potential is different from the second potential. In the embodiment, the M/S pin of the master detection chip is used for receiving a power supply potential, and the M/S pin of the slave detection chip is connected to the ground. In another implementation, the M/S pin of the master detection chip may be connected to the ground and the M/S pin of the slave detection chip may be connected to the power supply potential. Or, the M/S pin of the master detection chip and the M/S pin of the slave detection chip may be connected to different potentials. It should be noted that types of the first potential and the second potential are not limited in the embodiments of the present disclosure. Any two different potentials, based on which the master detection chip and the salve detection chip may be distinguished from each other, fall within the protection scope of the embodiments of the present disclosure.

Further, referring to FIG. 2, the master detection chip is arranged with a start signal output pin and a clock signal output pin, and the slave detection chip is provided with a start signal input pin and a clock signal input pin. The start signal output pin of the master detection chip is connected to the start signal input pin of the slave detection chip, thus the master detection chip controls the slave detection chip to perform touch detection. The clock signal output pin of the master detection chip is connected to the clock signal input pin of the slave detection chip, thus the master detection chip controls the slave detection chip to perform touch detection at the same frequency as the master detection chip.

In the embodiment shown in FIG. 2, the master detection chip transmits a clock signal 100 to the slave detection chip via the clock signal output pin and transmits a start signal 200 to the slave detection chip via the start signal output pin to drive the salve detection chip to acquire the touch signal of the touch screen, realizing synchronous operations of the master detection chip and the slave detection chip, and thereby ensuring collaborative operation of multiple detection chips. In addition, since parasitic capacitance exists between different detection electrodes in the screen body of the touch screen, noise caused by the interference due to asynchronous detection on the electrodes in different regions of the screen body may be avoided based on the synchronous operation of the master detection chip and the slave detection chip, thereby improving the detection accuracy.

Figure 3:
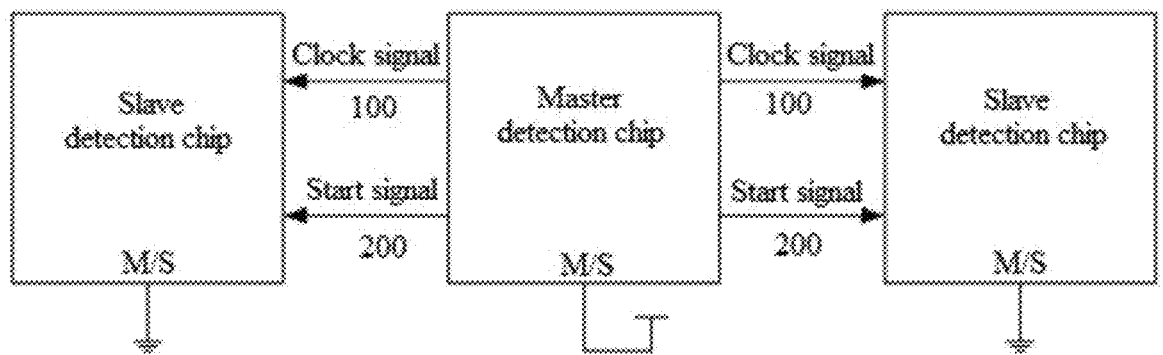
FIG. 3 is a schematic diagram of a touch screen detection chip combination according to another embodiment of the present disclosure.

In a case that the area of the touch screen is increased, the number of slave detection chips may be increased. For example, as show in FIG. 3, two salve detection chips, a first slave detection chip and a second slave detection chip, are arranged to meet the requirement of a touch screen with a large size. The first slave detection chip is arranged at one side of the master detection chip, and the second slave detection chip is arranged at the other side of the master detection chip. The first slave detection chip and the second slave detection chip perform touch detection on different regions of the touch screen. In the embodiment shown in FIG. 3, the master detection chip is arranged with two synchronous start signal output pins and two synchronous clock signal output pins. Each of the slave detection chips is arranged with one start signal input pin and one clock signal input pin. For each of the slave detection chips, the start signal input pin of the slave detection chip is connected to one of the start signal output pins of the master detection chip to receive a start signal 200 from the master detection chip, thus the master detection chip controls the slave detection chip to perform touch detection synchronously. For each of the slave detection chip, the clock signal input pin of the slave detection chip is connected to one of the clock signal output pins of the master detection chip to receive a clock signal 100 from the master detection chip, thus the master detection chip controls the slave detection chip to perform touch detection at the same frequency of the master detection chip. One master detection chip and two slave detection chips are combined to operate synchronously to perform touch detection cooperatively.

It should be noted that the number of the slave detection chips in the present disclosure is not limited to one or two mentioned above, and may be other numbers.

However, it is found that in the above solutions, in a case that the master detection chip directly transmits the clock signal and the start signal to the salve detection chip, the master detection chip may perform detection earlier the slave detection chip due to a line delay, not achieving accurate synchronization. To solve this problem, a solution is provided according to an embodiment. For ease of understanding, the solution is described in detail below with reference to FIG. 4.

Figure 4:
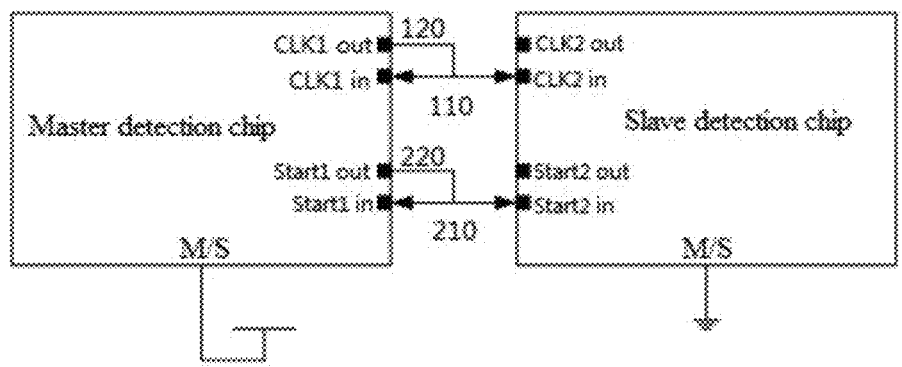
FIG. 4 is a schematic diagram of a touch screen detection chip combination according to another embodiment of the present disclosure.

As shown in FIG. 4, each of the master detection chip and the slave detection chip is arranged with a start signal output pin, a start signal input pin, a clock signal output pin, and a clock signal input pin. In order to distinguish the pins, the pins for performing the same function of the master detection chip and the slave detection chip are represented by different reference numerals in FIG. 4. The correspondence is as follows. The start signal output pin of the master detection chip is represented by Start1 out, the start signal input pin of the master detection chip is represented by Start1 in, the clock signal output pin of the master detection chip is represented by CLK1 out, and the clock signal input pin of the master detection chip is represented by CLK1 in. The start signal output pin of the slave detection chip is represented by Start2 out, the start signal input pin of the slave detection chip is represented by Start2 in, the clock signal output pin of the slave detection chip is represented by CLK2 out, and the clock signal input pin of the slave detection chip is represented by CLK2 in.

The start signal output pin Start1 out of the master detection chip is connected to a middle position between the master detection chip and the slave detection chip, and then is connected to the start signal input pin Start1 in of the master detection chip and the start signal input pin Start2 in of the slave detection chip, thus a start signal 220 from the master detection chip may be converted to a start signal 210, and the start signal 210 is transmitted to the pin Start1 in and the pin Start2 in. The clock signal output pin CLK1 out of the master detection chip is connected to a middle position between the master detection chip and the slave detection chip adjacent to the master detection chip, and then is connected to the clock signal input pin CLK1 in of the master detection chip and the clock signal input pin CLK2 in of the slave detection chip, thus a clock signal 120 from the master detection chip may be converted to a clock signal 110, and the clock signal 110 is transmitted to the pin CLK1 in and the pin CLK2. In the embodiment, the start signal 220 from the master detection chip is converted at a middle position between the master chip and the slave chip adjacent to the master chip and then is inputted to the master chip and the slave chip simultaneously, and the clock signal 120 from the master detection chip is converted at a middle position between the master chip and the slave chip adjacent to the master chip and then is inputted to the master chip and the slave chip simultaneously. For each of the middle positions, the distance between the master detection chip and the middle position is equal to the distance between the slave detection chip and the middle position. Therefore, the problem of asynchronous signal reception caused by distance is solved, and the master detection chip and the slave detection chip synchronously receive the start signal and synchronously receive the clock signal.

The connection between the pin Start1 out and the middle position used for the start signal 220, the connection between the middle position used for the start signal 220 and the pin Start1 in and the pin Start2 in, the connection between the pin CLK1 out and the middle position used for the clock signal 120, and the connection between the middle position used for the clock signal 120 and the pin CLK1 in and the pin CLK2 in may be performed by using peripheral circuits (that are, circuits not integrated inside the IC).

Since the master detection chip and the slave detection chip have the same structure, the slave detection chip is arranged a clock signal output pin CLK2 out and a start signal output pin Start2 out. However, the slave detection chip operates under the control of the master detection chip, and the slave detection chip only receives the clock signal and the start signal and does not transmit a clock signal and a start signal, thus the pins CLK2 out and Start2 out are not used.

It is further found that for the chip applied in an actual product, the clock signal in the detection chip has a fast speed. The peripheral circuit is generally implemented by a printed circuit board (PCB). It is difficult to transmit a high-speed signal on the PCB due to a large load of the PCB. If the master detection chip directly outputs a high-speed clock signal, the signal may be distorted, and the master detection chip or the slave detection chip cannot perform touch detection normally due to receiving an abnormal clock signal. To solve this problem, a solution is provided according to an embodiment of the present disclosure. The master detection chip is arranged with an up-conversion module for up-converting a frequency of a clock signal received via the clock signal input pin of the master detection chip, and the master detection chip performs touch detection at the up-converted frequency. The slave detection chip is arranged with an up-conversion module for up-converting a frequency of a clock signal received via the clock signal input pin of the slave detection chip, and the slave detection chip performs touch detection at the up-converted frequency.

Figure 5:
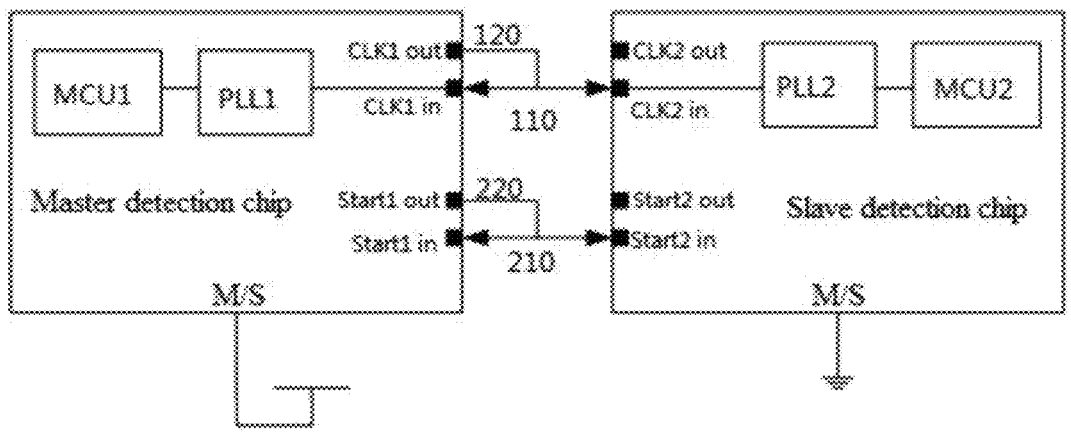
FIG. 5 is a schematic diagram of a touch screen detection chip combination according to another embodiment of the present disclosure.

For ease of understanding, referring to FIG. 5, the solution is described in detail below with reference to FIG. 5. In the embodiment, the up-conversion modules in the master detection chip and the salve detection chip are implemented by phase locked loops (PLLs), which are represented by PLL1 and PLL2 respectively. Each of the master detection chip and the slave detection chip is arranged with a micro control unit (MCU). The micro control units in the master detection chip and the slave detection chip are represented by MCU1 and MCU2 respectively. The master detection chip outputs a low-speed clock signal. The low-speed clock signal is converted and then is transmitted to the pin CLK1 in and the pin CLK2 in. The clock signal received by the master detection chip via the pin CLK1 in is up-converted by the PLL1 to obtain a high-speed clock signal, and the MCU in the master chip controls touch detection based on the high-speed clock signal. The clock signal received by the slave detection chip via the pin CLK2 in is up-converted by the PLL2 to obtain a high-speed clock signal, and the MCU in the slave chip controls touch detection based on the high-speed clock signal. The clock signals respectively received via the pin CLK1 in and via the pin CLK2 in are synchronous, thus the low-speed clock signal received by the phase-locked loop in the master chip is the same as the low-speed clock signal received by the phase-locked loop in the slave chip, and the high-speed clock signal generated by the PLL1 is the same as the high-speed clock signal generated by the PLL2. That is, the clock signals, based on which the master chip and the salve chip respectively perform touch detection, have the same frequency and the same phase. In addition to the phase-locked loop, the up-conversion module in the present disclosure may be implemented by other circuits or electronic devices for increasing the frequency of the clock signal, which is not limited in the embodiments of the present disclosure.

Preferably, in the above embodiments, one master detection chip and two slave detection chips operates together to perform detection on most of the touch screens of the conventional terminal devices. The number of the master detection chip is one, and the number of the slave detection chip is two. The two slave detection chips are respectively arranged at two sides of the master detection chip. The two slave detection chips may arranged in any one of the manners in which the master detection slave is connected to the slave detection chip described above, which is not repeated herein.

After the combination of the master detection chip and the slave detection chip receives a start signal, the master detection chip performs touch detection on a touch electrode in a region corresponding to the master detection chip, and the slave detection chip performs touch detection on a touch electrode in a region corresponding to the slave detection chip. For the master detection chip and the slave detection chip, the timing relationship of the clock signal, the start signal, and the detection signal of the electrode includes the following three cases. In a first case, the master detection chip performs one frame of touch detection after receiving a start signal, and the slave detection chip performs one frame of touch detection after receiving a start signal. In a second case, the master detection chip performs two or more frames of touch detection after receiving a start signal, and the slave detection chip performs two or more frames of touch detection after receiving a start signal. In a third case, the master detection chip performs one frame of touch detection after receiving two or more start signals, and the slave detection chip performs one frame of touch detection after receiving two or more start signals. For easy of understanding, the three cases are described in detail below in conjunction with the drawings.

In the first case, the master detection chip performs one frame of touch detection after receiving a start signal, and the slave detection chip performs one frame of touch detection after receiving a start signal.

Figure 6:
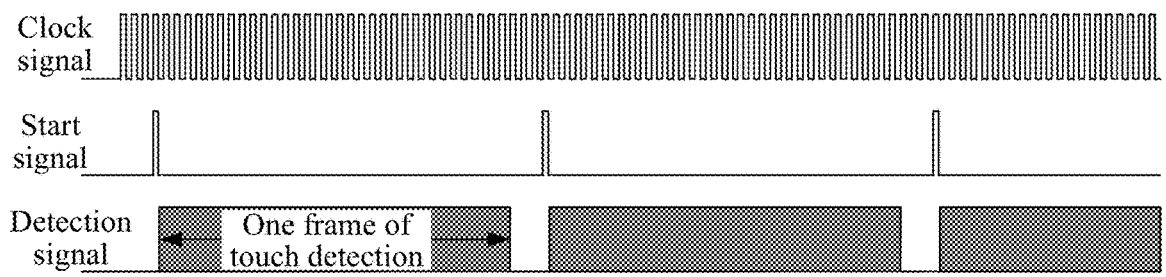
FIG. 6 is a schematic diagram showing a case of transmitting a signal in a touch screen detection chip combination according to an embodiment of the present disclosure.

As shown in FIG. 6, after a start signal pulse arrives, the master detection chip performs touch detection on a touch electrode corresponding to the master detection chip, and the slave detection chip performs touch detection on a touch electrode corresponding to the slave detection chip. For each start signal, the master detection chip and the slave detection chip respectively perform one frame of touch detection. After the one frame of touch detection is performed (or after a period of time after the one frame of touch detection), the master detection chip outputs a start signal pulse, then the master detection chip performs touch detection on the touch electrode corresponding to the master detection chip, and the slave detection chip performs touch detection on the touch electrode corresponding to the slave detection chip. The frequency of the start signal depends on a required frame rate of the touch detection, for example, the frequency of the start signal may be 60 Hz or 120 Hz. The manner in which the start signal is transmitted is the same as the manner described above, which is not repeated herein.

In the second case, the master detection chip performs two or more frames of touch detection after receiving a start signal, and the slave detection chip performs two or more frame of touch detection after receiving a start signal.

Figure 7:
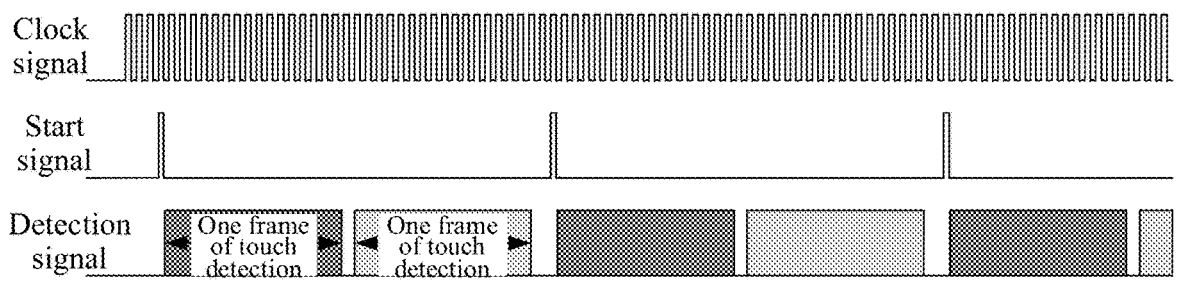
FIG. 7 is a schematic diagram showing a case of transmitting a signal in a touch screen detection chip combination according to another embodiment of the present disclosure.

As shown in FIG. 7, after a start signal pulse arrives, the master detection chip performs touch detection on a touch electrode corresponding to the master detection chip, and the slave detection chip performs touch detection on a touch electrode corresponding to the slave detection chip. For each start signal, the master detection chip and the slave detection chip respectively perform two frames (may be more than two frames in other embodiments) of touch detection. For the two frames or multiple frames of touch detection, manners and parameters may be the same or different. For example, in the two or multiple frames of touch detection, signal driving frequencies may be different, or self-capacitance detection is performed in one frame of touch detection and mutual-capacitance detection is performed in another frame of touch detection. After the two frames or multiple frames of touch detection are performed (or after a period of time from the two frames or multiple frames of touch detection), the master detection chip outputs a start signal pulse, then the master detection chip and the slave detection chip perform touch detection on the touch electrodes again. The frequency of the start signal depends on a frame rate of the touch detection, for example, the frequency of the start signal may be 60 Hz or 120 Hz.

In the third case, the master detection chip performs one frame of touch detection after receiving two or more start signals, and the slave detection chip performs one frame of touch detection after receiving two or more start signals.

Figure 8:
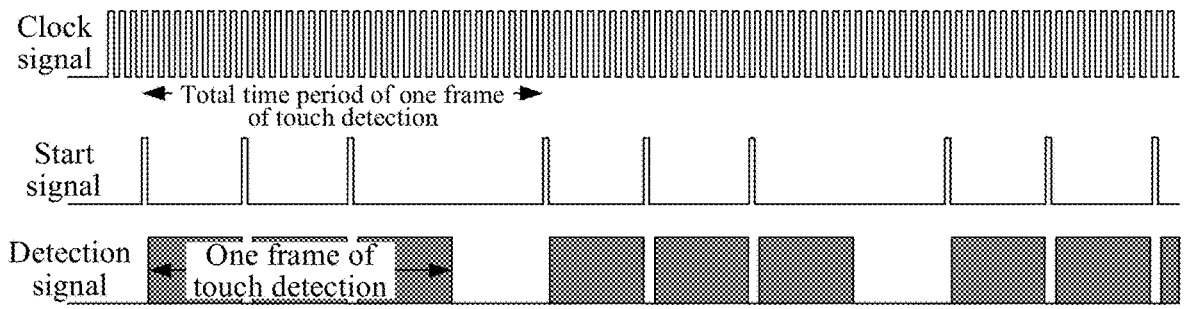
FIG. 8 is a schematic diagram showing a case of transmitting a signal in a touch screen detection chip combination according to another embodiment of the present disclosure.

Referring to FIG. 8, the differences between this case and the above two cases are as follows. It is required to divide one frame of touch detection into multiple parts to be performed, and each of the parts is started by one start signal pulse. Therefore, in a complete touch detection period, multiple start signal pulses are included, and the start signal pulses may be non-uniformly distributed. Assuming that the frame rate of the touch detection is 60 Hz, the complete touch detection period is 16.7 ms. Every 16.7 ms, multiple uniformly distributed or non-uniformly distributed start signal pulses may occur and touch detection may not be performed after each of the start pulses.

A terminal device is further provided according to an embodiment of the present disclosure. The terminal device includes a touch screen and a touch screen detection chip combination. The touch screen detection chip combination may be the touch screen detection chip combination according to any one of the embodiments described above with reference to FIG. 2 to FIG. 8.

In the embodiments of the present disclosure, it should be understood that the disclosed chips and circuits may be implemented in other manners. For example, the device embodiments described above are only illustrative. For example, the division of the circuits is only a division of logical functions, and the circuits may be divided in other manners in practical implementation. For example, multiple circuits or components may be combined or integrated in another system, or some features may be ignored or may not be realized. In addition, the mutual coupling, the direct coupling or the communication connection shown or discussed may be indirect coupling or communication connection through some interfaces, devices, or circuits, and may be in an electrical form, a mechanical form, or other forms.

The circuits described as separate components may be or may not be physically separated. The components displayed as circuits may be or may not be physical circuits, that is, the components may be arranged in one place or may be distributed in multiple network circuits. Some or all of the circuits may be selected according to actual requirements to achieve the objectives of the solutions according to the embodiments of the present disclosure.

Terms used in the embodiments of the present disclosure are only used for describing the embodiments rather than limiting the present disclosure. The terms "one", "the said", and "the" in a singular form used in the embodiments of the present disclosure and the appended embodiments are intended to include a plural form unless other meanings are clearly indicated in the context. The character "I" in the present disclosure generally indicates an "or" relationship between associated objects before and after "I".

The touch screen detection chip combination and the terminal device according to the embodiments of the present disclosure are described in detail above. The principle and the embodiments of the present disclosure are described in conjunction with examples. The above descriptions of the embodiments are used for helping understanding the method and the core idea of the present disclosure. In addition, for those skilled in the art, variations may be made on the embodiments and the application scope according to the idea of the present disclosure. In view of the above, the content of the specification should not be understood as limitation to the present disclosure.

The invention claimed is:

1. A touch screen detection chip combination, comprising a master detection chip and a slave detection chip, wherein
the master detection chip and the slave detection chip are configured to process touch signals of different regions of a touch screen;
the master detection chip is connected to the slave detection chip;
the master detection chip is configured to control the slave detection chip to perform touch signal process on the touch screen;
each of the master detection chip and the slave detection chip is arranged with a potential pin;
the master detection chip is configured to receive a first potential via the potential pin of the master detection chip, and the slave detection chip is configured to receive a second potential via the potential pin of the salve detection chip;
the first potential is different from the second potential;
each of the master detection chip and the slave detection chip is arranged with a start signal output pin, a start signal input pin, a clock signal output pin, and a clock signal input pin;
the start signal output pin of the master detection chip is connected to a middle position between the master detection chip and the slave detection chip adjacent to the master detection chip, and then is connected to the start signal input pin of the master detection chip and the start signal input pin of the slave detection chip, the master detection chip is configured to perform touch detection after receiving a start signal, and the slave detection chip performs touch detection after receiving a start signal; and
the clock signal output pin of the master detection chip is connected to a middle position between the master detection chip and the slave detection chip adjacent to the master detection chip, and then is connected to the clock signal input pin of the master detection chip and the clock signal input pin of the slave detection chip, the master detection chip performs touch detection after receiving a clock signal, and the slave detection chip performs touch detection at a same frequency as the master detection chip after receiving a clock signal.

2. The chip combination according to claim 1, wherein the first potential is a power supply potential and the second potential is a ground potential; or
the first potential is a ground potential and the second potential is a power supply potential.

3. The chip combination according to claim 1, wherein the master detection chip is arranged with a start signal output pin and a clock signal output pin, and the slave detection chip is arranged with a start signal input pin and a clock signal input pin;
the start signal output pin of the master detection chip is connected to the start signal input pin of the slave detection chip, to control the slave detection chip by the master detection chip to perform touch detection; and
the clock signal output pin of the master detection chip is connected to the clock signal input pin of the slave detection chip, to control the slave detection chip by the master detection chip to perform touch detection at a same frequency as the master detection chip.

4. The chip combination according to claim 3, wherein the number of the master detection chip is one and the number of the slave detection chip is more than one;
the master detection chip is arranged with a plurality of synchronous start signal output pins and a plurality of synchronous clock signal output pins, and each of the plurality of slave detection chips is arranged with one start signal input pin and one clock signal input pin; and
for each of the plurality of slave detection chips, the start signal input pin of the slave detection chip is connected to one of the plurality of start signal output pins of the master detection chip, and the clock signal input pin of the slave detection chip is connected to one of the plurality of clock signal output pins of the master detection chip.

5. The chip combination according to claim 4, wherein the number of the master detection chip is one, the number of the slave detection chip is two, and the two slave detection chips are respectively arranged at two sides of the master detection chip.

6. The chip combination according to claim 3, wherein the master detection chip performs one frame of touch detection after receiving a start signal, and the slave detection chip performs one frame of touch detection after receiving a start signal; or
the master detection chip performs two or more frames of touch detection after receiving a start signal, and the slave detection chip performs two or more frame of touch detection after receiving a start signal; or
the master detection chip performs one frame of touch detection after receiving two or more start signals, and the slave detection chip performs one frame of touch detection after receiving two or more start signals.

7. The chip combination according to claim 1, wherein the master detection chip is arranged with an up-conversion module for up-converting a frequency of a clock signal received via the clock signal input pin of the master detection chip, and the master detection chip performs touch detection at the up-converted frequency;
the slave detection chip is arranged with an up-conversion module for up-converting a frequency of a clock signal received via the clock signal input pin of the slave detection chip, and the slave detection chip performs touch detection at the up-converted frequency.

8. A terminal device, comprising:
a touch screen, and
a touch screen detection chip combination, comprising the touch screen detection chip combination according to claim 1.

9. The chip combination according to claim 1, wherein the number of the master detection chip is one, the number of the slave detection chip is two, and the two slave detection chips are respectively arranged at two sides of the master detection chip.

10. The chip combination according to claim 1, wherein the master detection chip performs one frame of touch detection after receiving a start signal, and the slave detection chip performs one frame of touch detection after receiving a start signal; or the master detection chip performs two or more frames of touch detection after receiving a start signal, and the slave detection chip performs two or more frame of touch detection after receiving a start signal; or the master detection chip performs one frame of touch detection after receiving two or more start signals, and the slave detection chip performs one frame of touch detection after receiving two or more start signals.

* * * * *